(12) United States Patent
Pang

(10) Patent No.: US 6,509,591 B2
(45) Date of Patent: Jan. 21, 2003

(54) THIN FILM TRANSISTOR WITH PHOTOCONDUCTIVE MATERIAL

(75) Inventor: Jia-Pang Pang, Taichung Hsien (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/052,729

(22) Filed: Jan. 18, 2002

(65) Prior Publication Data

US 2002/0096676 A1 Jul. 25, 2002

(30) Foreign Application Priority Data

Jan. 20, 2001 (TW) .......................... 90101545

(51) Int. Cl.$^7$ .................... H01L 31/062; H01L 31/113; H01L 29/04; H01L 31/20; H01L 31/036
(52) U.S. Cl. ........................ 257/291; 257/59; 257/72; 257/350
(58) Field of Search ............... 257/59, 72, 350, 257/291, 292, 293

(56) References Cited

U.S. PATENT DOCUMENTS

| | | | | |
|---|---|---|---|---|
| 5,894,136 A | * | 4/1999 | Wook | 257/59 |
| 5,962,896 A | * | 10/1999 | Yabuta et al. | 257/347 |
| 5,962,916 A | * | 10/1999 | Nakanishi et al. | 257/640 |
| 5,990,492 A | * | 11/1999 | Kim | 257/59 |
| 6,046,479 A | * | 4/2000 | Young et al. | 257/350 |
| 6,191,452 B1 | * | 2/2001 | Oda et al. | 257/347 |
| 6,281,552 B1 | * | 8/2001 | Kawasaki et al. | 257/350 |

* cited by examiner

*Primary Examiner*—Ngân V. Ngô
(74) *Attorney, Agent, or Firm*—Ladas & Parry

(57) ABSTRACT

A thin film transistor made with photoconductive material. The thin film transistor comprises a transparent substrate, a gate electrode on the transparent substrate, a dielectric layer on the gate electrode and the transparent substrate, a photoconductive layer on the dielectric layer, a source electrode on the dielectric layer and the photoconductive layer and located at one side of the gate electrode, a drain electrode on the dielectric layer and the photoconductive layer and located beside another side of the gate electrode, and a passivation layer on the source electrode, drain electrode, photoconductive layer and the dielectric layer. The invention is characterized in that the drain and gate electrodes do not overlap and the photoconductive layer located under the drain electrode and above the gate electrode forms a photoconductive region.

12 Claims, 6 Drawing Sheets

THIN FILM TRANSISTOR WITH PHOTOCONDUCTIVE MATERIAL

BACKGROUND OF THE INVENTION

1. Field of the Invention

The invention relates to a thin film transistor with photoconductive material. More particularly, the invention reduces the parasitic capacitance between the source and gate, increases the clear aperture of each pixel, and eliminates flicker and feed-through voltage by providing a thin film transistor with photoconductive material.

2. Description of the Related Art

FIG. 1A is a top view schematically showing a pixel of a liquid crystal display in the prior art. As shown in FIG. 1A, the liquid crystal pixel 1 has an aperture 10, a gate line 20 adjacent to one side of the aperture 10, and a data line 30 adjacent to another side of the aperture 10. The liquid crystal material is confined in the aperture 10, and the gate line 20 has a thin film transistor 40 for controlling the liquid crystal whether the light passes through it or not. FIG. 1B schematically shows a cross-section of the thin film transistor taken along the line A–A' of FIG. 1A. As shown in FIG. 1B, a metal gate layer 402 is formed on a transparent substrate 401, such as glass (e.g., Corning 1737, from Corning Glass, Japan) by sputter deposition, standard lithographic techniques and dry etching. The metal gate layer 402 is opaque to light in the thin film transistor structure. A dielectric layer 403 is formed on the metal gate layer 402 and the substrate 401, and then an amorphous Si layer 404 is formed on the dielectric layer 403. A source electrode 406 is formed on the amorphous Si layer 404 and the dielectric layer 403 over one side of the metal gate layer 402, and a drain electrode 407 is also formed on the amorphous Si layer 404 and the dielectric layer 403 over another side of the metal gate layer 402. Thus, the thin film transistor (TFT) has a channel 408 formed between source 406 and drain electrodes 407. A passivation layer 405 is next formed on the dielectric layer 403, source electrode 406, drain electrode 407, and amorphous layer 404. In FIG. 1B, the drain electrode 407 overlaps the metal gate layer 402 to form a drain overlap 409a, and the source electrode 406 overlaps the metal gate layer 402 to form a source overlap 409b. Thus, the source overlap 409b conducts electricity between the source electrode 406 and metal gate layer 402, and the drain overlap 409a conducts electricity between the drain electrode 407 and metal gate layer 402. However, the parasitic capacitance is established between the source/drain electrode and the metal gate layer where they overlap one another. FIG. 1C schematically shows an equivalent circuit of the liquid crystal pixel having the parasitic capacitance. Each liquid crystal pixel 50 is provided with TFT 52, which acts as a switch for addressing the liquid crystal pixel. The gate electrode 54 of TFT 52 is connected to gate line 60, and the source electrode 56 of TFT 52 is connected to data line 62. The drain electrode 58 of TFT 52 is connected to a display element 66, such as a liquid crystal pixel. FIG. 1D illustrates a number of the disadvantageous consequences of parasitic capacitance and feed-through voltage. At time t1, the voltage on data line 62 is high, but the voltage on gate line 60 is low. Consequently, voltage is not permitted to flow between data line 62 and pixel 66, and the pixel is opaque or OFF. At time t2, the voltage on data line 62 remains high, but the voltage on gate line 60 goes from low to high (typically 10–20 volts). The channel of TFT 52 is consequently opened. This results in application of voltage from data line 62 to pixel 66, causing pixel 66 to become transparent or ON. Pixel 66 typically has a certain degree of inherent capacitance, shown as $C_{pix}$. Also, due to the architecture of an integrated TFT, there typically is an overlap between the drain electrode 58 of the TFT 52 and gate electrode 54. This results in a capacitance $C_{gd}$ between the drain and gate. Thus, between time t2 and time t3, voltage at pixel 66 is as intended. At time t3, the voltage on gate line 60 is switched to low. Charge in the channel of TFT 52 is thereby depleted. However, at this time there is a difference in potential across $C_{gd}$, which causes part of the charge stored in $C_{pix}$ to be redistributed to $C_{gd}$, resulting in a voltage drop, $\Delta V_p$, referred to as feed-through voltage. In the case of a display apparatus, the feed-through voltage results in aforementioned image "flicker". At time t4, voltage on the data line 62 is low, and the voltage on gate line 60 is switched from low to high. This once again opens the channel of TFT 52, and the capacitance $C_{pix}$ is discharged to the line level of data line 62, switching pixel 66 OFF. AT time t5, voltages on both the gate line 60 and the data line 62 are low. However, again there is a difference in potential across $C_{gd}$, which results in another feed-through voltage drop. The drop voltage is represented as $$\Delta V_p = [C_{gd}/(C_{pix}+C_{gd})] \times \Delta V_g,$$

wherein $C_{pix}$ is the inherent capacitance of the liquid crystal pixel, and $C_{gd}$ is a parasitic capacitance between the drain and gate.

Another prior art provides a storage capacitance for reducing the influence of parasitic capacitance on pixel voltage and eliminating the flicker. As shown in FIG. 2A, each pixel provides a storage capacitance 70 at respective aperture 10. However, the storage capacitance occupies partial aperture of the pixel and reduces the brightness of the liquid crystal display. FIG. 2B schematically shows an equivalent circuit of the liquid crystal pixel having the storage capacitance. In FIG. 2B, each pixel has a drop voltage, and the drop voltage is represented as $$\Delta V_p = [C_{gd}/(C_{st}+C_{pix}+C_{gd})] \times \Delta V_g,$$

wherein $C_{pix}$ is the inherent capacitance of the liquid crystal pixel, $C_{gd}$ is a parasitic capacitance between the drain and gate, and $C_{st}$ is the storage capacitance. As the Cst is increased, the drop voltage $\Delta V_p$ caused by the parasitic capacitance is decreased. However, as the parasitic capacitance is larger, the clear aperture of each pixel is smaller and the brightness of the liquid crystal display is lower.

Moreover, each liquid crystal panel is divided into several regions, and then each region forms a plurality of pixels by photolithography. The pixels in respective regions are slightly dissimilar. Further, the dimensions of the drain overlap and source overlap in each TFT are also slightly dissimilar, and the phenomenon results in different parasitic capacitance in respective pixels, and the liquid crystal display shows Shot Mura on screen.

SUMMARY OF THE INVENTION

To solve the above problems, it is an object of the present invention to provide a liquid crystal display of thin film transistor with photoconductive material. When light illuminates the photoconductive material, a current/signal is conducted between the drain electrode and gate electrode. When light is blocked from illuminating the photoconductive material, it is insulated between the drain and gate. The invention further reduces the parasitic capacitance between the drain and gate.

The invention has an advantage of reducing or eliminating the parasitic capacitance and feed-through voltage by providing photoconductive material between the drain electrode and gate electrode.

The invention has another advantage of increasing the brightness of the liquid crystal display by forming individual pixels without storage capacitance.

The invention has another advantage of reducing or eliminating the flicker and Shot Mura by forming a photoconductive layer between the drain electrode and gate.

BRIEF DESCRIPTION OF THE DRAWINGS

This and other objects and features of the invention will become clear from the following description, taken in conjunction with the preferred embodiments with reference to the drawings, in which.

DETAILED DESCRIPTION OF THE PREFERRED EMBODIMENTS

Figure 1A:
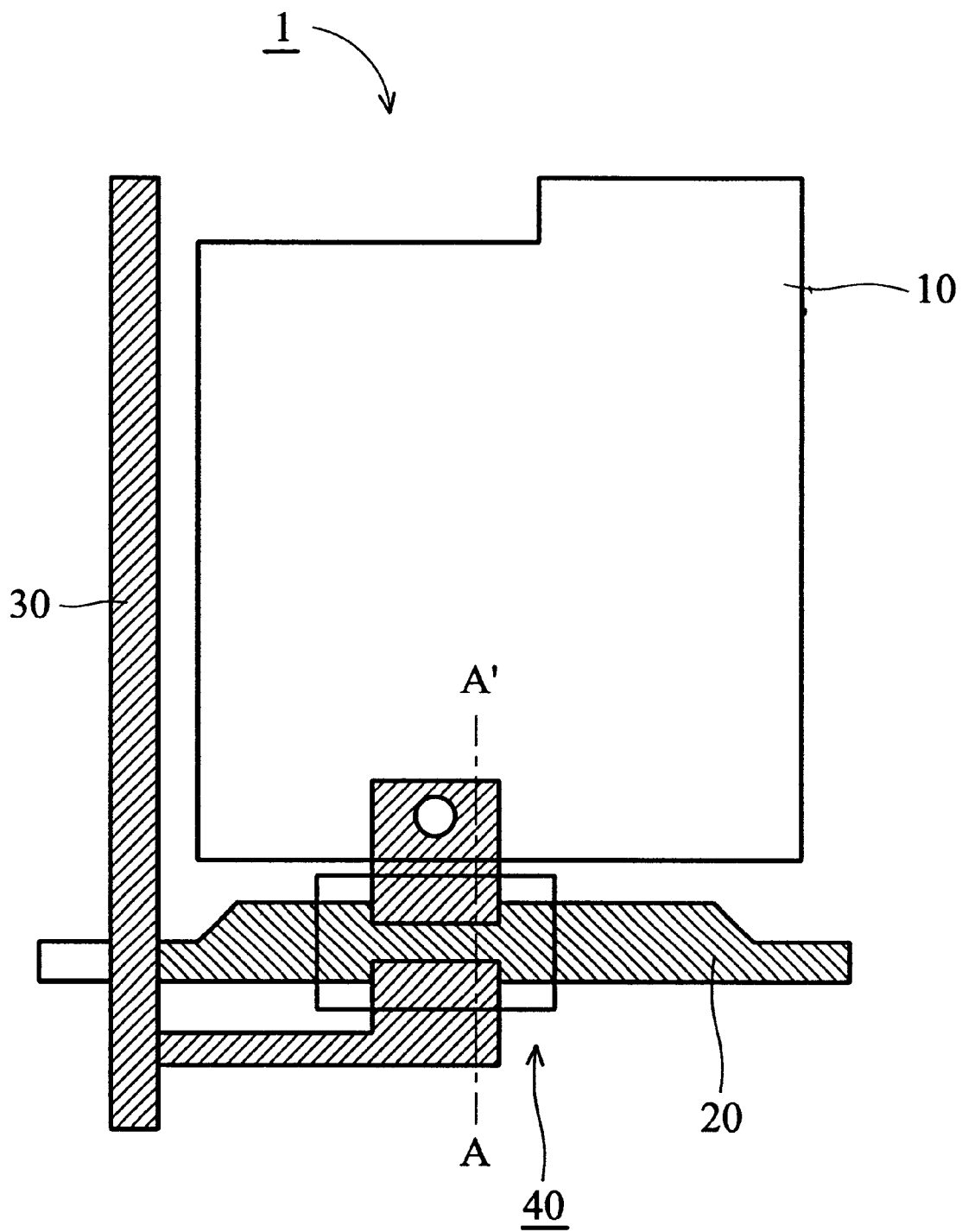
FIG. 1A is a top view schematically showing a pixel of a liquid crystal display in the prior art.
Figure 1B:
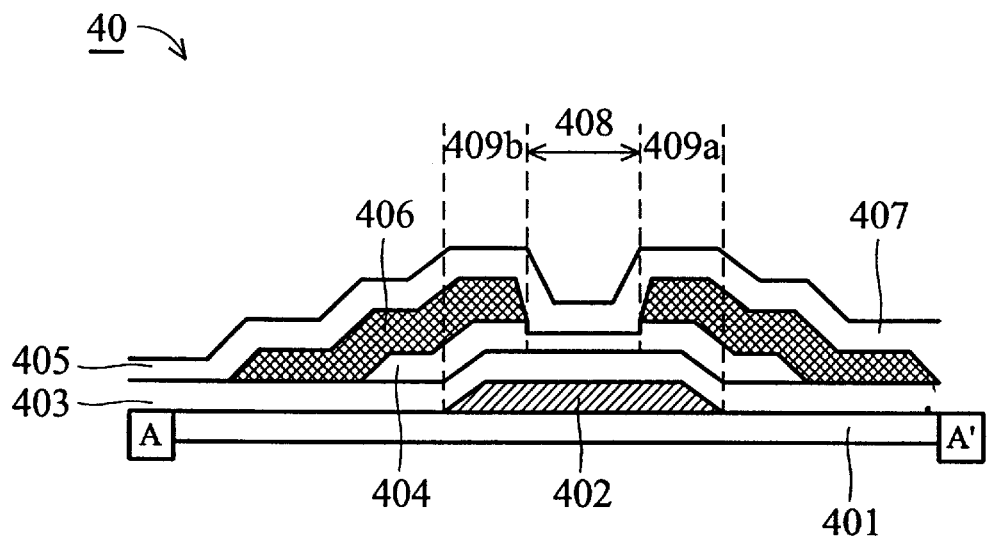
FIG. 1B schematically shows a cross-section of the thin film transistor taken along the line A–A' of FIG. 1A.
Figure 1C:
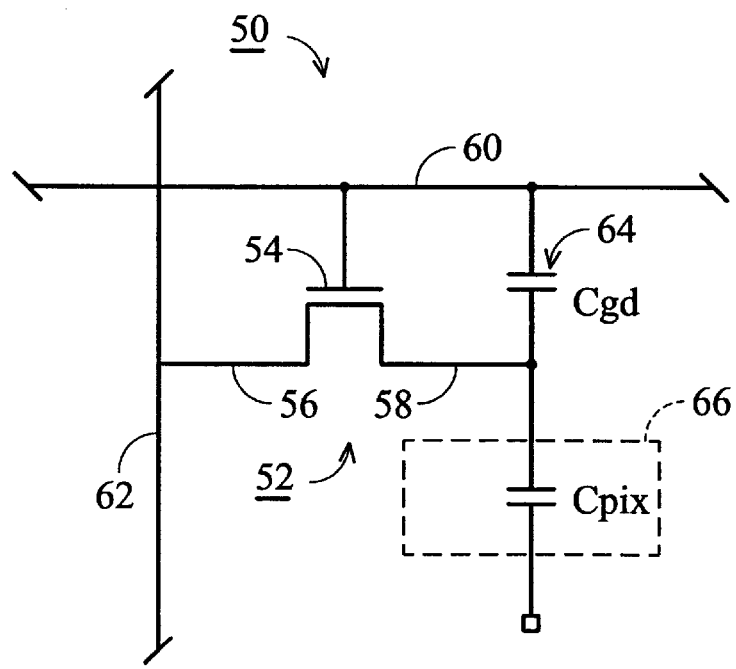
FIG. 1C schematically shows an equivalent circuit of the liquid crystal pixel having the parasitic capacitance.
Figure 1D:
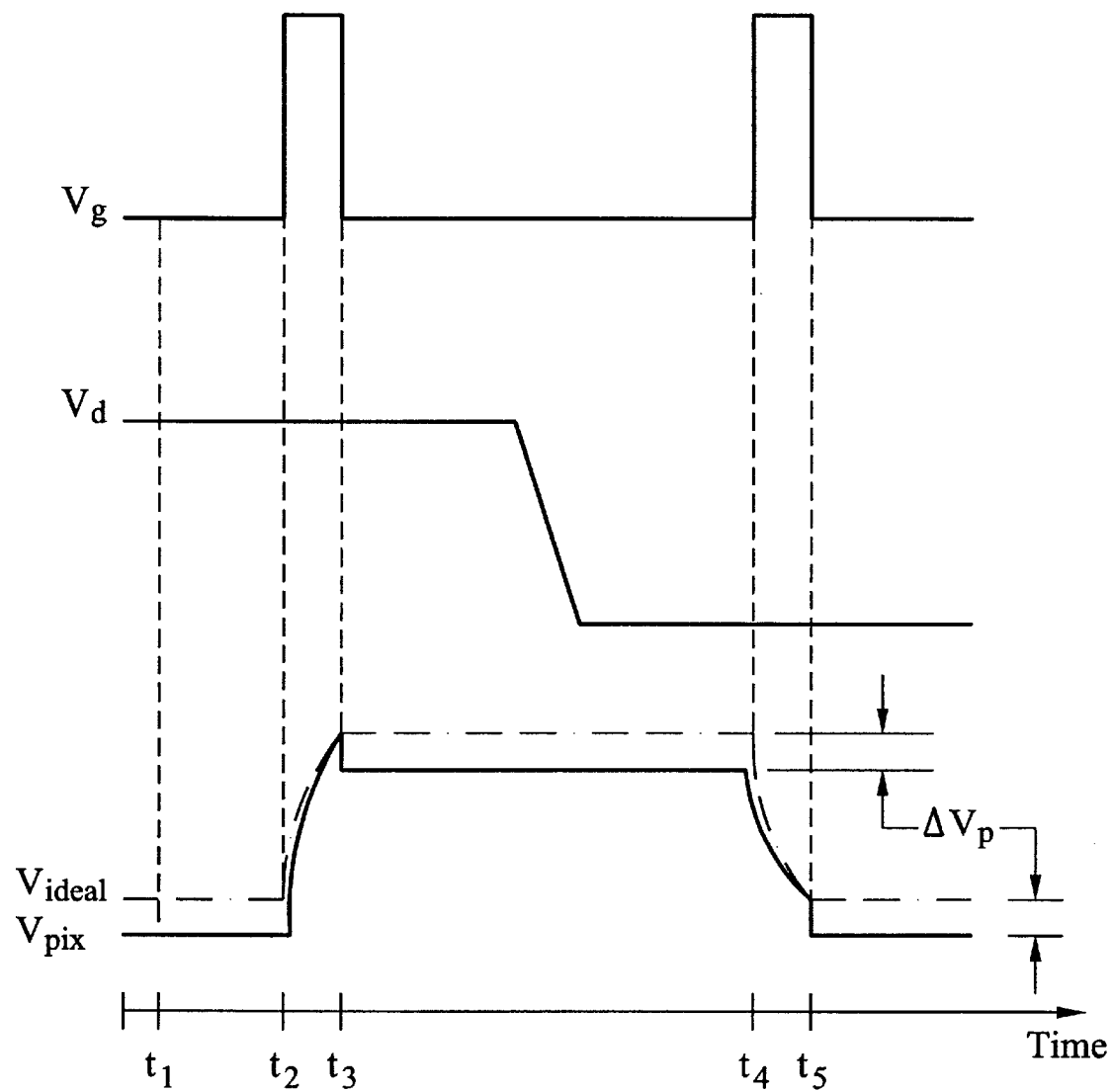
FIG. 1D schematically shows the time sequence of a liquid crystal pixel in the prior art.
Figure 2A:
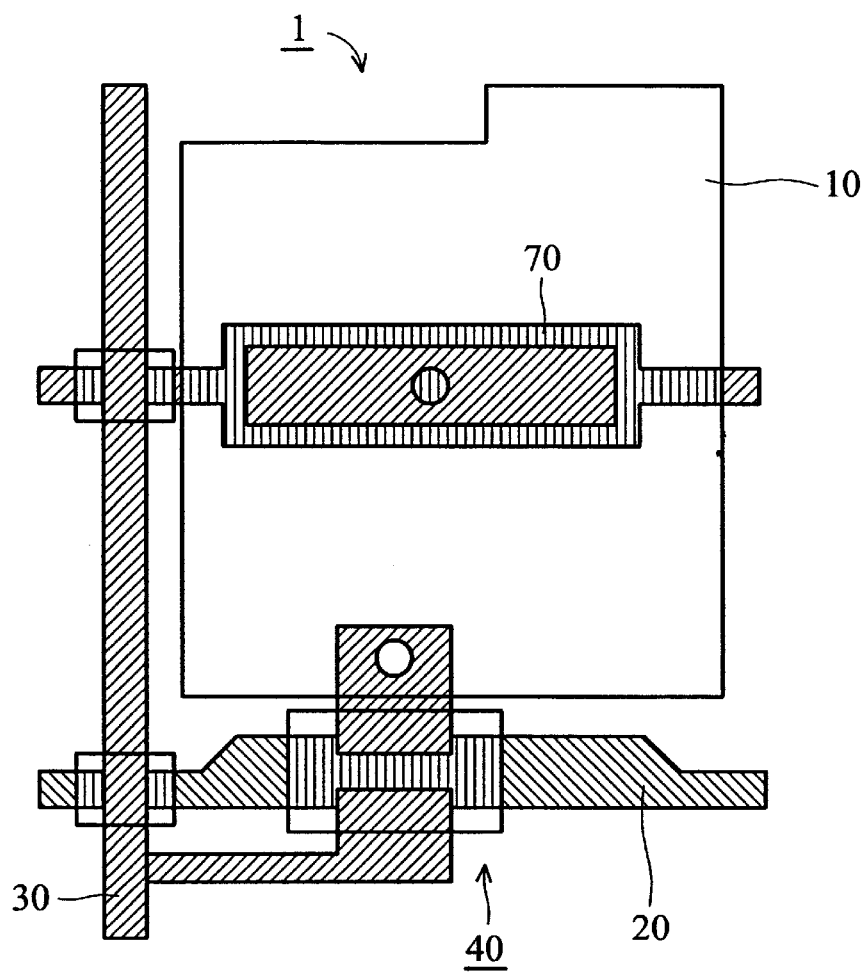
FIG. 2A is another top view schematically showing a pixel of a liquid crystal display in the prior art.
Figure 2B:
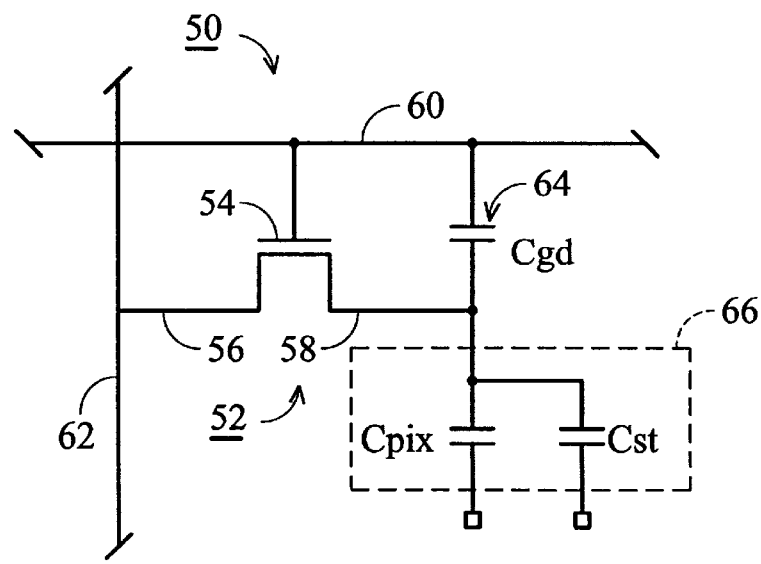
FIG. 2B schematically shows an equivalent circuit of the liquid crystal pixel having the parasitic capacitance.
Figure 3A:
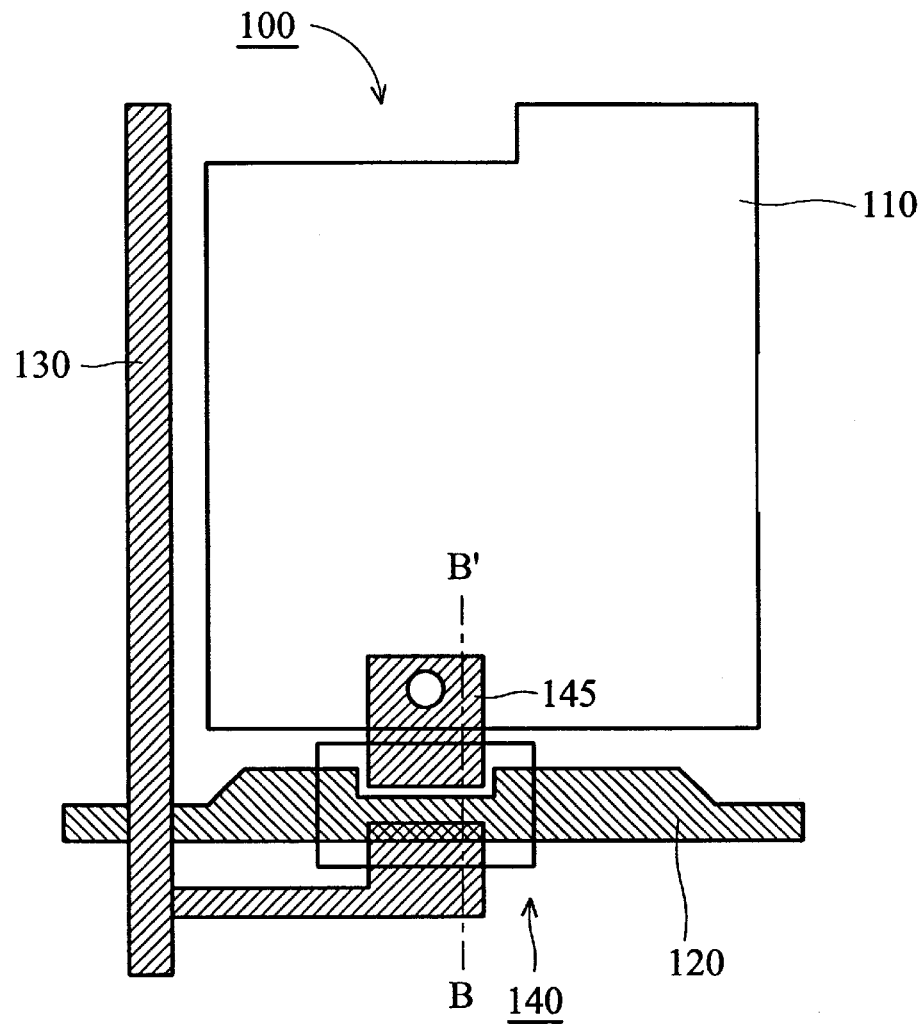
FIG. 3A is a top view of a liquid crystal pixel according to the embodiment of the invention.
Figure 3B:
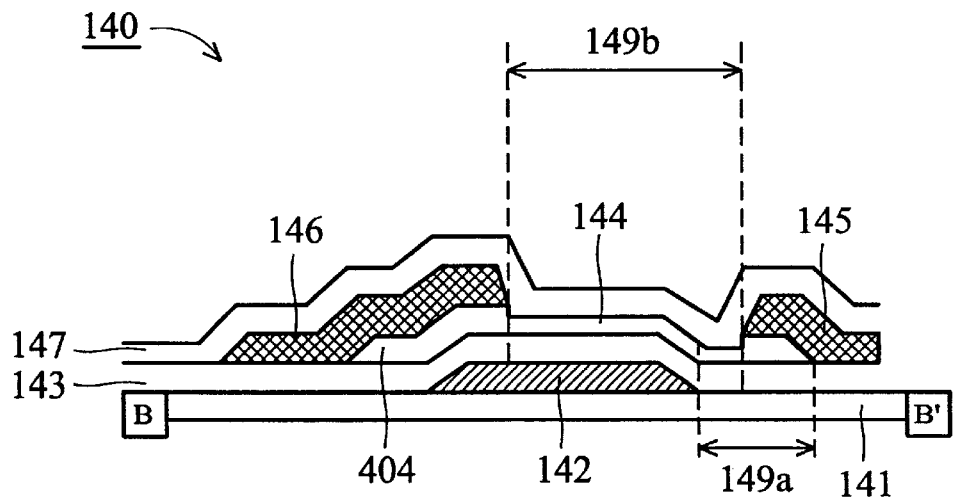
FIG. 3B schematically shows a cross-section of the thin film transistor taken along the line B–B' of FIG. 3A.

FIG. 3A is a top view of a liquid crystal pixel according to the embodiment of the invention. The liquid crystal pixel 100 has a pixel aperture 110 surrounded by a gate line 120 and a data line 130, wherein the gate line 120 and data line 130 overlap and are insulated from short. The gate line 120 is provided with a thin film transistor (TFT) 140. FIG. 3B schematically shows a cross-section of the thin film transistor taken along the line B–B' of FIG. 3A.

Referring to FIGS. 3A and 3B, a metal gate layer 142 for example Cr, TiW, MoCr, etc., is formed on a transparent substrate 141, such as glass (e.g., Corning 1737, from Corning Glass, Japan), quartz, etc. by sputter deposition, standard lithographic techniques and dry etching.

Over gate electrode 120(142), a gate dielectric layer 143 is formed by plasma enhanced chemical deposition. In general, the gate dielectric layer 143 is made of silicon nitride (SiN) A photoconductive layer 144 is further formed on the gate dielectric layer 143. In the invention, the photoconductive layer 144 is made of amorphous silicon or other material inducing current by illumination. For example, the photoconductive layer 144 is also made of $Cu\alpha(In_xGa_{1-x})\beta(Se_yS_{1-y})\gamma$ which is used in the solar power battery.

A drain 145 and source electrodes 146 are respectively formed on the photoconductive layer 144 and dielectric layer 143, beside the gate line 142. Referring to FIGS. 3A, and 3B, the drain electrode 145 does not overlap the gate electrode 142, and the photoconductive layer 144 located under the drain electrode 145 and above the gate electrode 142 forms a photoconductive region 149a. Above the gate electrode 142, a channel 149b is also formed between the drain 145 and source electrodes 146. A passivation layer 147 is next formed on the dielectric layer 143, source electrode 146, drain electrode 145, and photoconductive layer 144. The material of the passivation layer 147 can be silicon nitride.

When light emitted from the light guide plate illuminates the TFT, most light is blocked by the gate electrode and prevents leakage current in the channel between the drain and source electrodes. In the invention, the light, which is not blocked by the gate electrode, illuminates the photoconductive region, and the insulating amorphous silicon changes to a conductive region. The resistance of the photoconductive region is about $10^6$ Ω, when light illuminates the photoconductive region. The resistance of the photoconductive region is about $10^{12}$ Ω when no light shines thereon. Consequently, when light illuminates the photoconductive region, the photoconductive region changes from insulative to conductive and the signals are conducted between the drain and gate electrodes.

The invention provides a photoconductive region to forsake the drain overlap between the drain and gate electrodes, and prevents formation of parasitic capacitance.

Figure 4A:
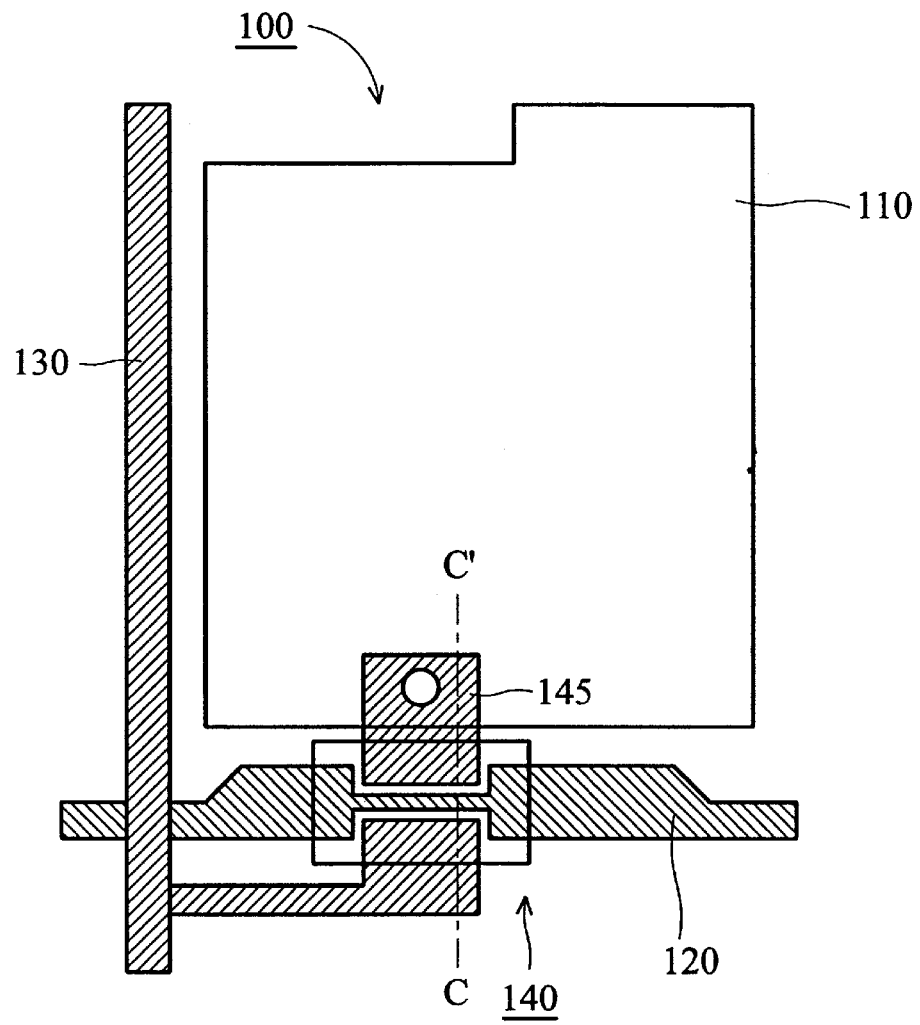
FIG. 4A is another top view of a liquid crystal pixel according to the embodiment of the invention.
Figure 4B:
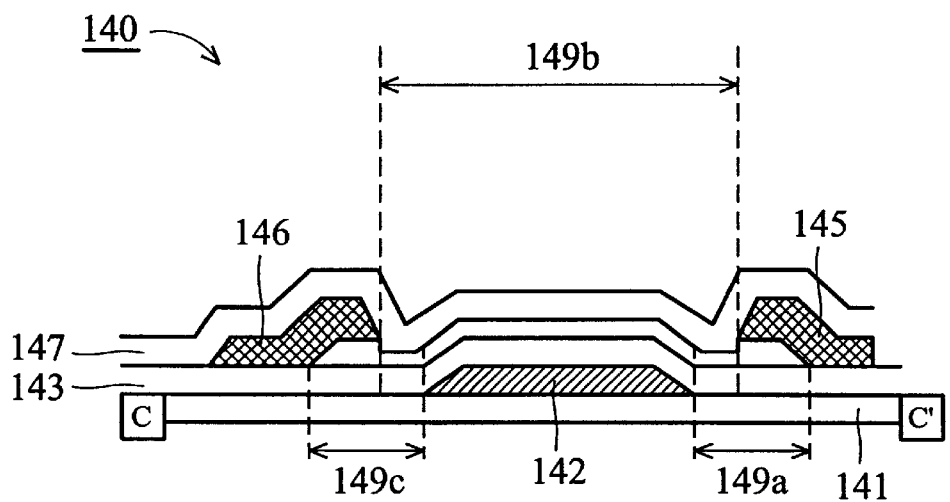
FIG. 4B schematically shows another cross-section of the thin film transistor taken along the line C–C' of FIG. 4A.

FIG. 4A is another top view of a liquid crystal pixel according to the embodiment of the invention. FIG. 4B schematically shows another cross-section of the thin film transistor taken along the line C–C' of FIG. 4A. As shown in FIGS. 4A and 4B, the photoconductive layer located under the source electrode 146 and above the gate electrode 142 forms another photoconductive region 149c. When light illuminates the photoconductive region 149c, and the signals are delivered between the source and the gate electrodes via the photoconductive region 149c.

While the preferred embodiment of the present invention has been described, it is to be understood that modifications will be apparent to those skilled in the art without departing from the spirit of the invention. The scope of the invention, therefore, is to be determined solely by the following claims.

What is claimed is:

1. A thin film transistor with photoconductive material comprising:

a transparent substrate;

a gate electrode formed on the transparent substrate;

a dielectric layer formed on the gate electrode and the transparent substrate;

a photoconductive layer formed on the dielectric layer;

a source electrode formed on the dielectric layer and the photoconductive layer and located at one side of the gate electrode;

a drain electrode formed on the dielectric layer and the photoconductive layer and locating beside another side of the gate electrode, wherein the drain electrode and the gate electrode do not overlap and the photoconductive layer located under the drain electrode and above the gate electrode forms a photoconductive region; and a passivation layer formed on the source electrode, drain electrode, photoconductive layer and the dielectric layer;

wherein when light illuminates the photoconductive region, the photoconductive region changes from insulative to conductive and signals are conducted between the drain and gate electrodes.

2. A thin film transistor with photoconductive material as claimed in claim 1, wherein the source electrode overlaps the gate electrode.

3. A thin film transistor with photoconductive material as claimed in claim 1, wherein the source electrode does not overlap the gate electrode.

4. A thin film transistor with photoconductive material as claimed in claim 1, wherein the transparent substrate is provided with glass.

5. A thin film transistor with photoconductive material as claimed in claim 1, wherein the transparent substrate is provided with quartz.

6. A thin film transistor with photoconductive material as claimed in claim 1, wherein the dielectric layer is made of silicon nitride.

7. A thin film transistor with photoconductive material as claimed in claim 1, wherein the photoconductive layer is made of amorphous silicon.

8. A thin film transistor with photoconductive material as claimed in claim 1, wherein the passivation layer is made of silicon nitride.

9. A thin film transistor with photoconductive material as claimed in claim 3, wherein the photoconductive layer located under the source electrode and above the gate electrode forms another photoconductive region.

10. A thin film transistor with photoconductive material as claimed in claim 1, wherein the photoconductive layer is made of $C_u\alpha(In_xGa_{1-x})\beta(Se_yS_{1-y})\gamma$.

11. A thin film transistor with photoconductive material as claimed in claim 9, wherein when light illuminates the photoconductive region, the photoconductive region changes from insulative to conductive and the signals are conducted between the source and gate electrodes.

12. A thin film transistor with photoconductive material as claimed in claim 1, wherein the photoconductive region avoids drain overlap and presents formation of parasitic capacitance between the drain electrode and the gate electrode.

* * * * *